(12) United States Patent
Yui et al.

(10) Patent No.: US 8,022,305 B2
(45) Date of Patent: Sep. 20, 2011

(54) SEMICONDUCTOR DEVICE WITH A WIRING BOARD HAVING AN ANGLED LINEAR PART

(75) Inventors: Takashi Yui, Shiga (JP); Atsushi Saiki, Niigata (JP)

(73) Assignee: Panasonic Corporation, Osaka (JP)

( * ) Notice: Subject to any disclaimer, the term of this patent is extended or adjusted under 35 U.S.C. 154(b) by 327 days.

(21) Appl. No.: 12/428,860

(22) Filed: Apr. 23, 2009

(65) Prior Publication Data
US 2009/0284942 A1    Nov. 19, 2009

(30) Foreign Application Priority Data

May 19, 2008   (JP) ................. 2008-131321
Jan. 13, 2009  (JP) ................. 2009-004483

(51) Int. Cl.
    *H05K 1/00*       (2006.01)
(52) U.S. Cl. ..................................... 174/250
(58) Field of Classification Search ......... 174/250–262; 257/620, 787–792; 361/704
    See application file for complete search history.

(56) References Cited

U.S. PATENT DOCUMENTS

| | | | |
|---|---|---|---|
| 5,691,242 A | 11/1997 | Nomi et al. | |
| 5,886,876 A | 3/1999 | Yamaguchi | |
| 6,774,500 B1 * | 8/2004 | Nakayama | 257/788 |
| 7,859,084 B2 * | 12/2010 | Utsumi et al. | 257/620 |
| 2007/0187136 A1 * | 8/2007 | Higashiguchi et al. | 174/250 |
| 2009/0071698 A1 * | 3/2009 | Chao et al. | 174/257 |
| 2009/0266584 A1 * | 10/2009 | Tsumura et al. | 174/252 |
| 2009/0272563 A1 * | 11/2009 | Tsai et al. | 174/255 |
| 2010/0307797 A1 * | 12/2010 | Watanabe | 174/254 |
| 2011/0061910 A1 * | 3/2011 | Sung et al. | 174/258 |

* cited by examiner

*Primary Examiner* — Chandrika Prasad
(74) *Attorney, Agent, or Firm* — McDermott Will & Emery LLP (57) ABSTRACT

A semiconductor device fabrication method includes: forming an elongated hole 5 in a wiring board plate along a perimeter line 3 of a plurality of wiring board regions defined over the wiring board plate with a connecting portion left unremoved at a corner of each of the wiring board regions; mounting semiconductor elements on the wiring board regions; and cutting the connecting portion using a punch 8 to isolate the wiring board regions from the wiring board plate into wiring boards. Each of the wiring boards has a cut edge formed by the punch, the cut edge starting from an end of the elongated hole 5 provided on a first side of the perimeter line 3 and extending across part of the connecting portion inside the perimeter line 3, the cut edge being angled inward of the wiring board so as to slope downward from the end of the elongated hole 5.

4 Claims, 13 Drawing Sheets

SEMICONDUCTOR DEVICE WITH A WIRING BOARD HAVING AN ANGLED LINEAR PART

CROSS-REFERENCE TO RELATED APPLICATION

This application claims priority from Japanese Patent Application JP2008-131321 filed on May 19, 2008 and Japanese Patent Application JP2009-004483 filed on Jan. 13, 2009, the disclosure of which applications is hereby incorporated by reference into this application in its entirety for all purposes.

BACKGROUND

A technology disclosed in this specification relates to a semiconductor device having a wiring board with a semiconductor element mounted thereon and to a method for fabricating the same.

Size reduction of electronic devices in recent years intensely demands size reduction and higher packaging density of semiconductor devices installed in the electronic devices. To meet the demand, the form of the semiconductor devices has shifted from conventional insertion type, such as DIP (Dual Inline Package), to surface-mount type, such as SOP (Small Outline Package) and QFP (Quad Flat Package). The package forms more widely adopted in recent years with the aim of achieving advanced size reduction and higher packaging density are a package called BGA (Ball Grid Array) where external terminals are arranged in an array over a whole face of the lower part of the device, and a package called CSP (Chip Size Package) where external terminals are arranged with shorter intervals than BGA and the package size is smaller than BGA. The essential features and fabrication methods of BGA and CSP are described below.

The wiring board generally employed for BGA and CSP is a multilayered wiring board including an organic material. The multilayered wiring board includes a wire part formed of a metal material, such as Cu, and an insulator part formed of, for example, a resin or glass cloth. Mounting of a semiconductor element on the wiring board is generally achieved by wire-bonding but, in some cases, by flip-chip mounting with the aim of improving electrical properties. The semiconductor element mounted on the wiring board may be overmolded with a resin when necessary. Also, in general, the back surface of the wiring board (the face opposite to the surface with the semiconductor element mounted thereon) is provided with solder balls which serve as the external terminals.

A method for fabricating BGA and CSP is now described. Fabrication of BGA and CSP employs a wiring board plate for improvement in production efficiency which is to be separated into a plurality of wiring boards carrying semiconductor elements mounted thereon. Specifically, the semiconductor elements are mounted at predetermined positions on the wiring board plate and, when necessary, the semiconductor elements are overmolded, or solder balls are fixed over the back surface which serve as external terminals. Then, in the final step, the wiring board plate is cut along a wiring board perimeter line into individual wiring boards. The two typical perimeter-cutting methods described below are known in the art.

The first method is dicing with a diamond blade, or the like, for separation into semiconductor devices. This method uses a diamond-coated file blade for perimeter cutting and, therefore, a resultant semiconductor device having an improved cut surface roughness is produced. Dicing however needs to be carried out along the perimeter lines of the respective semiconductor devices, which is disadvantageous in respect of workability and mass-productivity. Also, to prevent degradation of semiconductor device edges due to frictional heat from the dicing saw, spraying of water, or the like, over the dicing saw is necessary. In this case, the semiconductor element mounted on the wiring board is exposed to water, and therefore, there is a concern that the semiconductor element absorbs moisture, resulting in addition of drying the semiconductor devices after perimeter cutting.

The second method consists of loading the wiring board plate via registration holes formed in the wiring board plate in advance to fix the position of the wiring board plate and then punching the wiring board plate using a metal mold along the perimeter lines for separation into semiconductor devices. This method is superior to the first method in respect of workability and mass-productivity and is as of now the most popular among the existing ones. A commonly-employed method example of punching the wiring board plate with a metal mold is a combination of elongated hole formation with a drill called a router and punch stamping. A conventional wiring board fabrication method based on the combination of elongated hole formation and punch stamping is described below with reference to FIGS. 12 to 16.

Figure 12A:
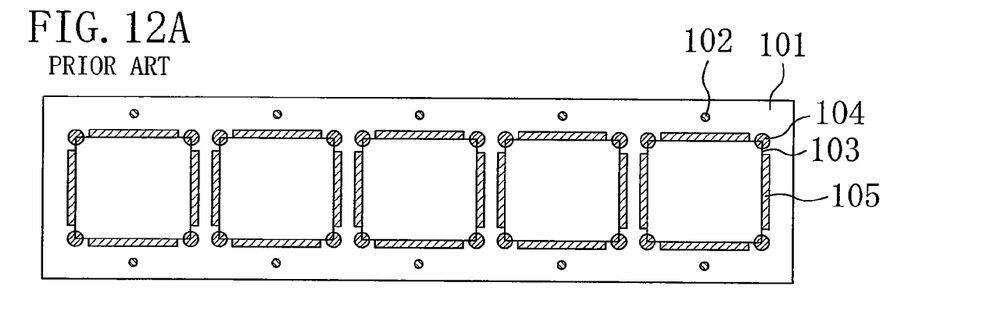
FIGS. 12A to 12C are plan views illustrating a conventional wiring board fabrication method.
Figure 12B:
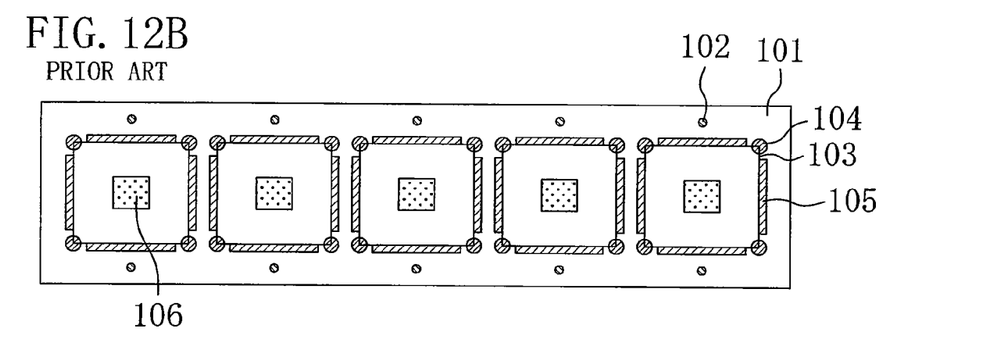
Figure 12C:
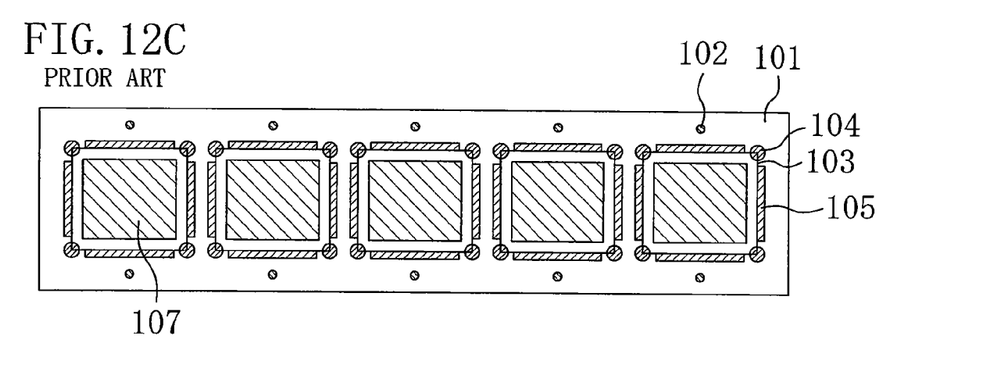
Figure 13:
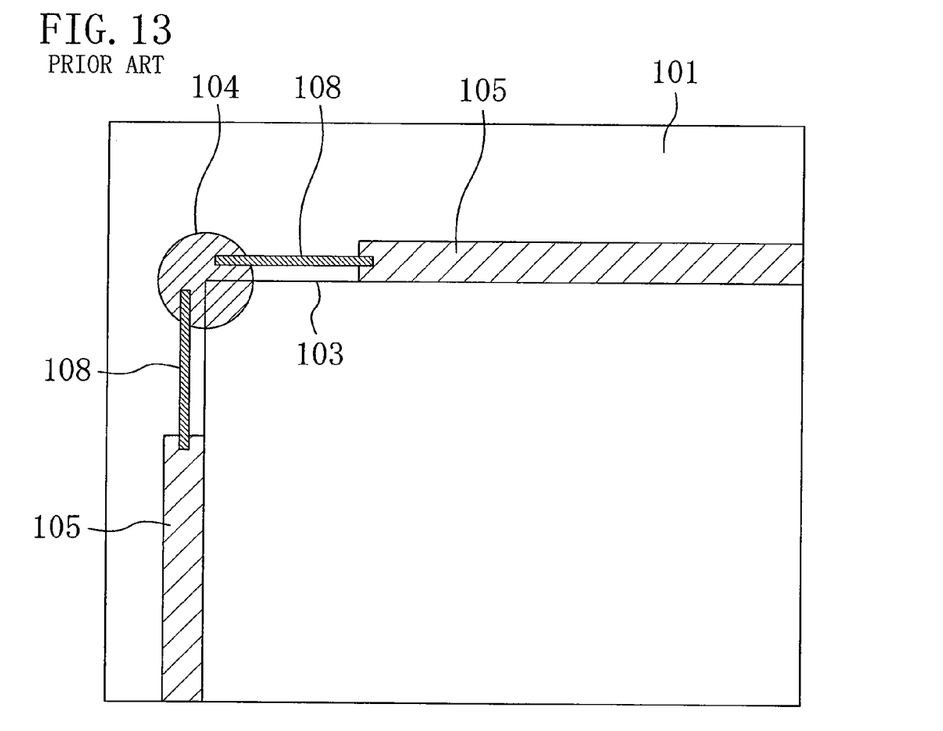
FIG. 13 is an enlarged plan view showing a corner of a conventional wiring board region.
Figure 14:
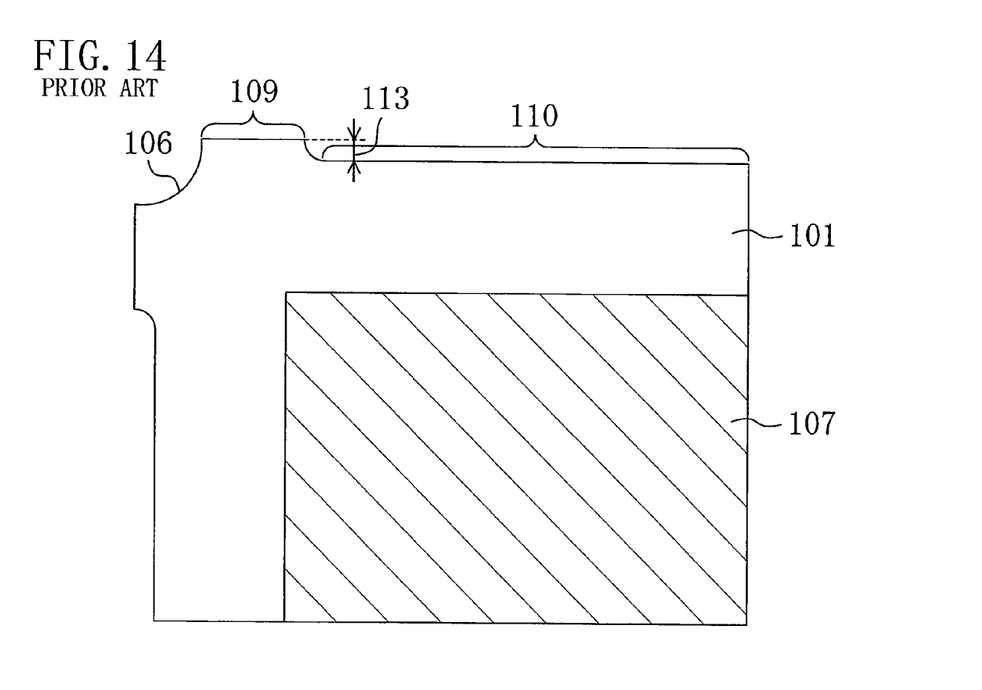
FIG. 14 is a plan view of a conventional wiring board after fabrication.

FIGS. 12A to 12C are plan views illustrating a conventional wiring board fabrication method. FIG. 13 is an enlarged plan view showing a corner of the perimeter line of a semiconductor device region during punch stamping. FIG. 14 is a plan view of a conventional wiring board after fabrication.

Referring to FIG. 12A, the first step is forming registration holes 102 in a wiring board plate 101 and holes 104 at the corners in a perimeter line 103 of respective semiconductor device regions (wiring board regions) defined over the wiring board plate 101. Note that the holes 104 are for making rounded surfaces at the corners of the semiconductor device. Then, elongated holes 105 are formed in the wiring board plate 101 using a router so as to extend between adjacent holes 104. Each of the elongated holes 105 is formed such that the inner longitudinal side of the elongated hole 105 is coincident with the perimeter line 103 of the semiconductor device region. Note that the length of a portion between an end of the elongated hole 105 and the hole 104 (unremoved portion) is set so as to secure such a strength that the wiring board plate 101 survives subsequent device assembly steps without being broken in the unremoved portion.

Referring to FIG. 12B, semiconductor elements 106 are then mounted on the resultant wiring board plate 101 at predetermined positions in the wiring board regions. The mounted semiconductor elements 106 are then overmolded with sealing resin 107 as shown in FIG. 12C. Thereafter, although not shown, for example, solder balls are fixed over the back surface of the wiring board region which serve as external terminals.

Referring to FIG. 13, the unremoved portions between the ends of the elongated holes 105 and the holes 104, which connect the semiconductor device regions to the frame of the wiring board plate 101, are then punched out to isolate the semiconductor device regions into semiconductor devices. In this way, the wiring boards are fabricated.

SUMMARY

The present inventors however found that the conventional wiring board fabrication method causes the disadvantages shown in FIG. 14. FIG. 14 is a plan view of a wiring board fabricated using the conventional wiring board fabrication method. Referring to FIG. 14, the conventional wiring board fabrication method results in that the first cut lint 109 formed by punch stamping is outer than the second cut line 110 formed by formation of the elongated hole 105 so that there is a step 113 between the first cut lint 109 and the second cut line 110. As a result, the wiring board has a shape partially protruding outward. This is because the punching location is set outer than the perimeter line 103 of the semiconductor device region. Punching part of the wiring board inner than the elongated hole 105 would deform the edges of the elongated hole 105, increasing the probability of device breakage. Specifically, the positioning accuracy of the elongated holes 105 relative to the registration holes 102 formed in the wiring board plate 101 is about 0.10 mm to 0.15 mm. The positioning accuracy of the punching locations 108 relative to the registration holes 102 is about 0.05 mm. To prevent deformation of the edges of the elongated holes 105 due to punching 108, the punching location 108 needs to be set outer than the perimeter line 103 of the semiconductor device region (wiring board region), along which the elongated hole 105 is formed, by at least about 0.15 mm.

Figure 15:
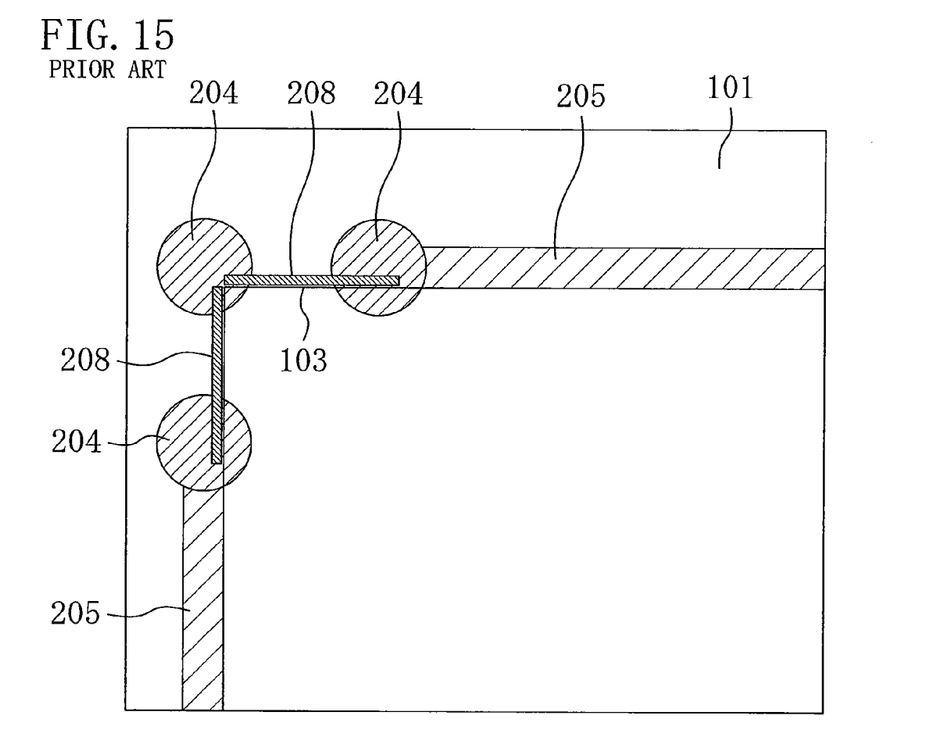
FIG. 15 is an enlarged plan view showing a corner of another conventional wiring board region.
Figure 16:
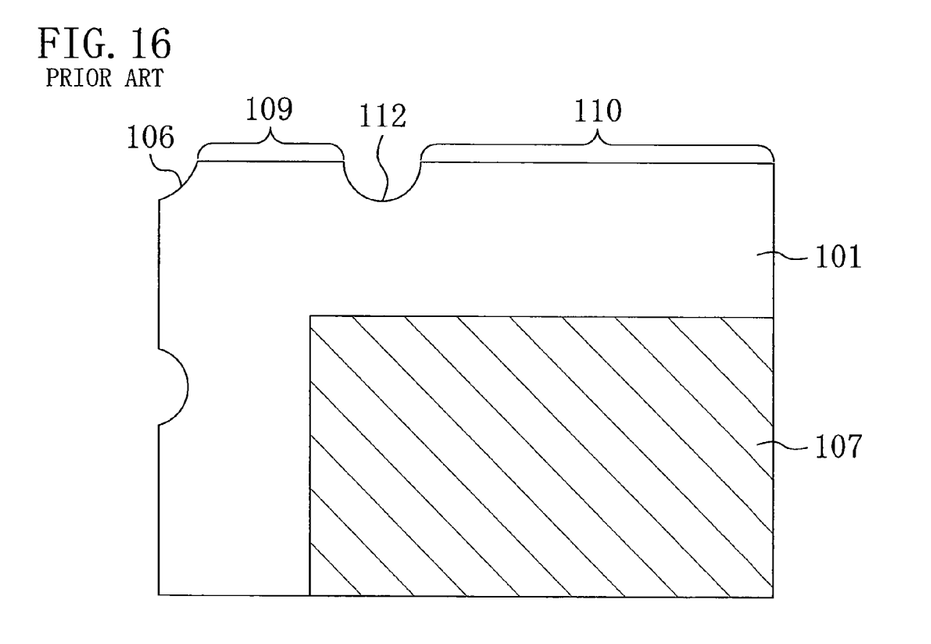
FIG. 16 is a plan view of another conventional wiring board after fabrication.

To avoid the disadvantages of the above conventional method, a wiring board fabrication method described below is proposed. FIG. 15 is a plan view illustrating a punch stamping step in the conventional wiring board fabrication method. FIG. 16 is a plan view of a conventional wiring board after fabrication. Note that FIGS. 15 and 16 are enlarged views showing a corner of the perimeter line of a semiconductor device.

Referring to FIG. 15, the conventional wiring board fabrication method includes forming end holes 204 at the ends of elongated holes 205. With this structure, even if the punching location of a punch 208 falls inside the perimeter line due to the tolerance, the end of the punch 208 falls within the end hole 204, decreasing the probability that the peripheral shape of the semiconductor device is deformed by punching during fabrication. In this case, however, referring to FIG. 16, the fabricated wiring board 101 has the third cut line 112 formed by the end hole 204 of the elongated hole 205. As a result, the wiring board 101 has a recess which forms steps in the perimeter line of the wiring board 101 as in the wiring board of FIG. 14.

Thus, using any of the above conventional methods results in formation of protrusions and recesses which form steps in the perimeter line of the wiring board. With the steps in the perimeter line of the wiring board, there is a probability that the semiconductor device is irregularly sandwiched or caught by an inspection socket or transport tray when inserted into or pulled out of the inspection socket or transport tray, resulting in breakage of the semiconductor device.

A type of wiring board commonly employed is formed by a base material of woven glass fiber which is molded with a resin. The wiring board of this type can have fuzzing of deformed fiber in the cut surface due to deformation of the fiber by punch stamping, for example. The fuzzes of deformed fiber can deteriorate the quality of the semiconductor device product or deteriorate the detection accuracy of an optical detector which detects the perimeter line of the semiconductor device, so that the detector cannot accurately detect the perimeter line due to the fuzzed fiber. According to the conventional methods, the cut line formed by punch stamping is parallel to the perimeter line of the semiconductor device, and therefore, fiber extending in a direction coincident with the cut line can have many fiber deformations, resulting in fuzzing of fiber.

Semiconductor device embodiments and semiconductor device fabrication method embodiments of the present invention are free from the above disadvantages so that the probability of formation of a large step in a cut line of an isolated semiconductor device is decreased, and the probability of breakage of the device during fabrication and subsequent process steps is also decreased.

One specific embodiment of the present invention is a method for fabricating a semiconductor device including a semiconductor element mounted on a wiring board, the method including: forming an elongated hole in a wiring board plate along a perimeter line of a plurality of wiring board regions defined over the wiring board plate with a connecting portion left unremoved at a corner of each of the wiring board regions; mounting semiconductor elements on the wiring board regions; and cutting the connecting portion using a punch to isolate the wiring board regions from the wiring board plate into wiring boards, each of the wiring boards having a cut edge formed by the punch, the cut edge starting from an end of the elongated hole provided on a first side of the perimeter line and extending across part of the connecting portion inside the perimeter line, the cut edge being angled inward of the wiring board so as to slope downward from the end of the elongated hole.

According to this method, at the punching step, the connecting portion is cut by the punch such that the isolated wiring board has a cut edge angled inward of the wiring board relative to the longitudinal direction of the elongated hole provided on the first side. An end of the punch falls in a region closer to the central part of the wiring board as compared with the conventional method. As a result, the end of the punch is prevented from falling on the end of the elongated hole, so that breakage of the elongated hole by the punch is avoided, and the perimeter line of the isolated semiconductor device is hence without damages. Therefore, by using the semiconductor device fabrication method of the present invention, breakage of the semiconductor devices which would occur in the steps during and subsequent to fabrication of the wiring boards can be prevented even if the size of the wiring boards is decreased, and accordingly, semiconductor devices with high quality can be produced.

Another specific embodiment of the present invention is a semiconductor device including: a wiring board; and a semiconductor element mounted on the wiring board, wherein at least one side of the wiring board is formed by a first linear part extending toward a corner of the wiring board and a second linear part angled inward of the wiring board so as to slope downward from the first linear part to the corner of the wiring board.

In this structure, at least one side of the wiring board is formed by the first linear part and the second linear part which is angled inward of the wiring board relative to the first linear part. The perimeter line of this semiconductor device does not have a large step as compared with the conventional semiconductor devices. Thus, a semiconductor device with high quality can be produced without deteriorating the linearity of the perimeter line. In the case where the wiring board is formed by a fiber base material molded with a resin, a small part of the perimeter line extends in parallel to the fibers as compared with the conventional semiconductor devices due to the second linear part that is not parallel to the first linear part. Thus, large exposure of the fibers over a processed surface, which would result in fuzzing of the fibers, can be prevented.

With the above features of the specific examples of the inventive semiconductor device and fabrication method thereof, a semiconductor device having no large step in the perimeter line can be produced even if the size of the semiconductor device is decreased. Thus, a high quality semiconductor device with smaller damages can be produced.

DETAILED DESCRIPTION

Embodiment 1

Figure 1A:
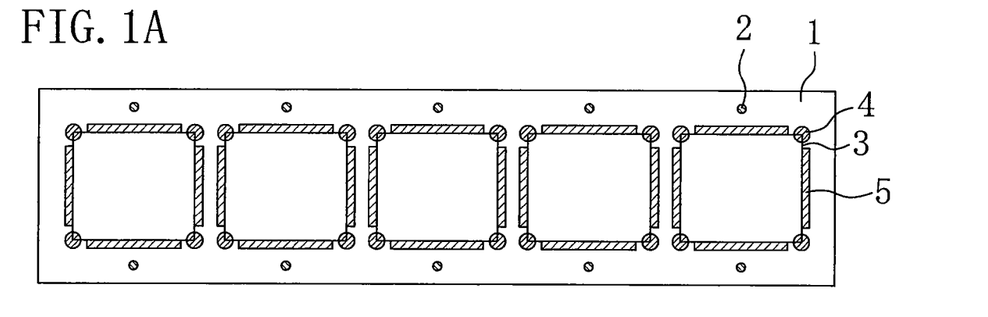
FIGS. 1A to 1C are plan views illustrating a semiconductor device fabrication method according to embodiment 1 of the present invention.
Figure 1B:
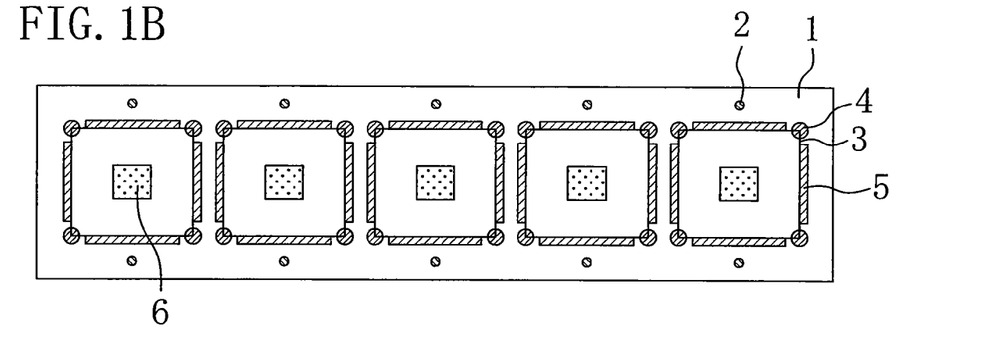
Figure 1C:
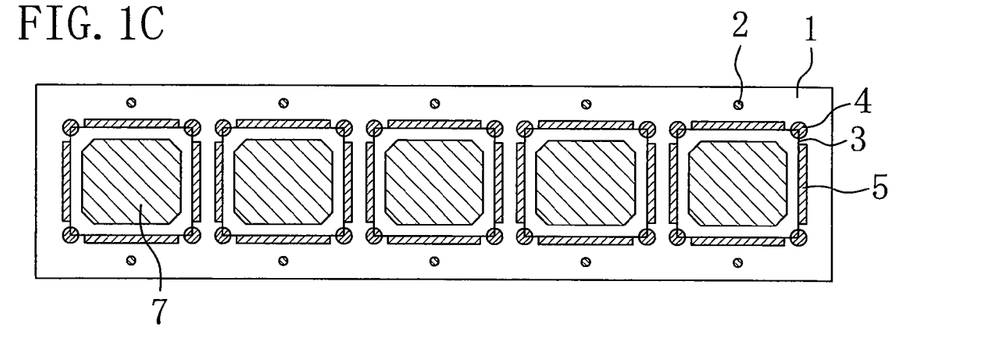
Figure 2:
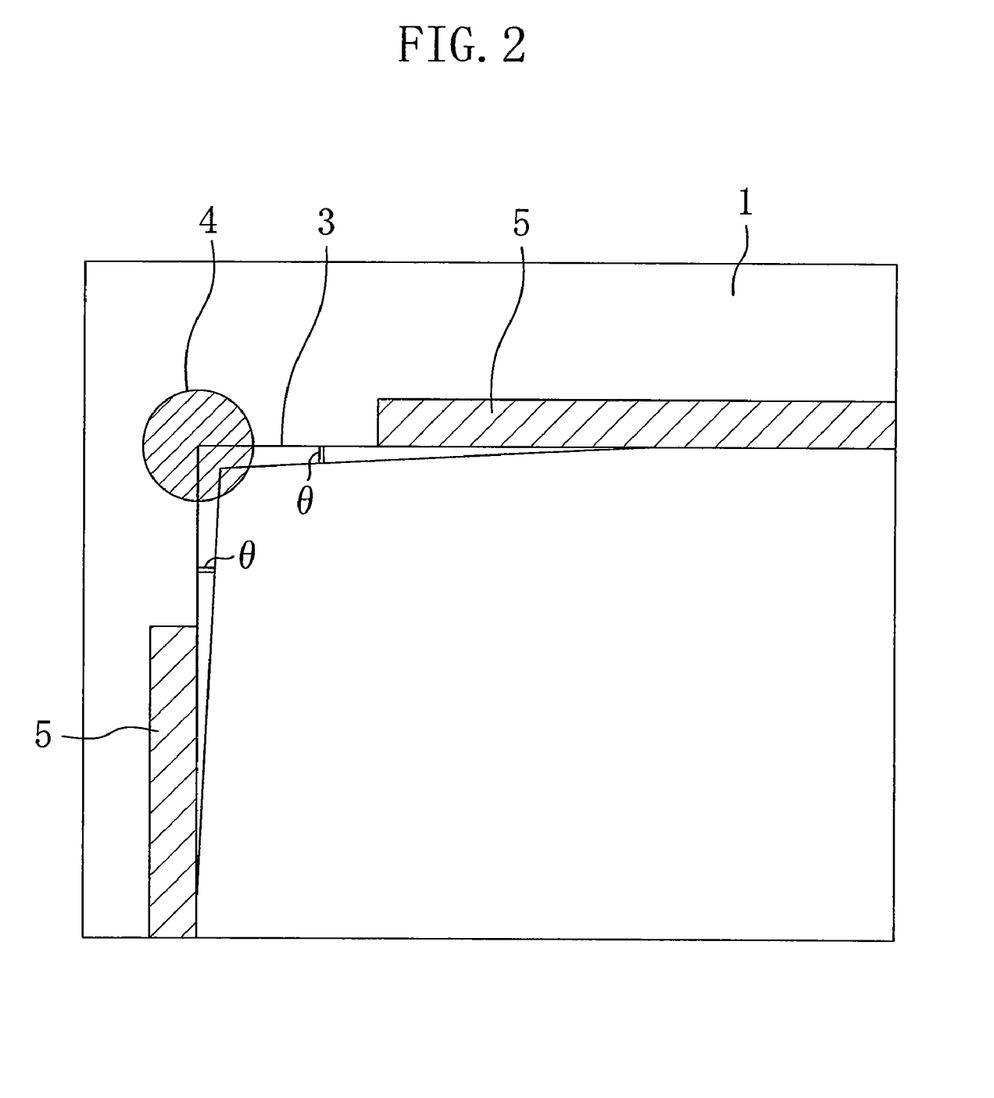
FIG. 2 is an enlarged plan view showing a corner of a wiring board region according to embodiment 1.
Figure 3A:
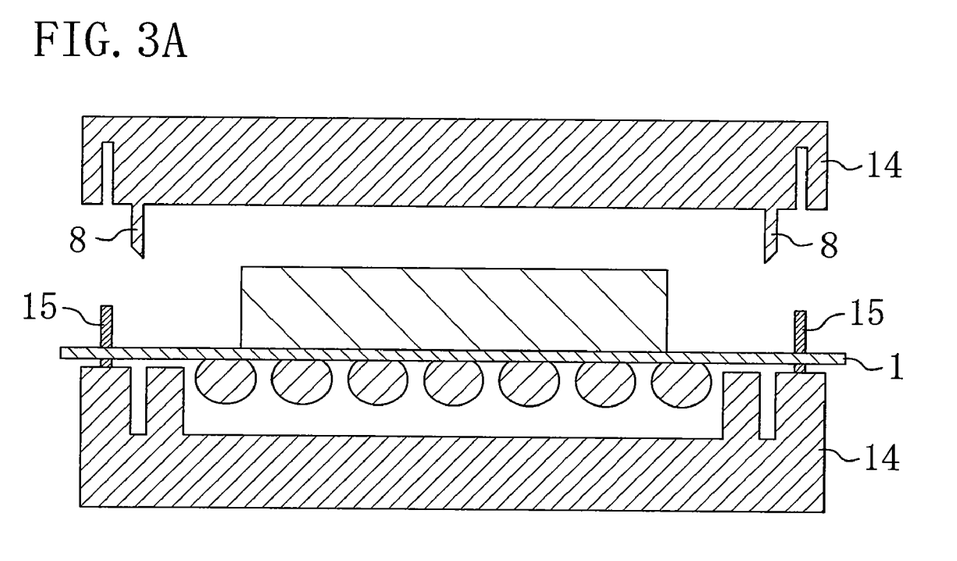
FIGS. 3A and 3B illustrate the semiconductor device fabrication method according to embodiment 1.
Figure 3B:
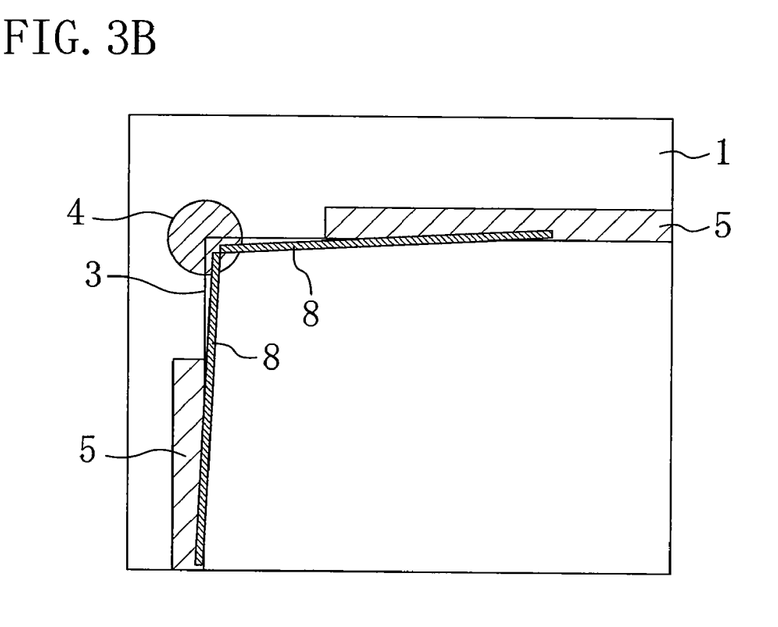

Hereinafter, a method for fabricating a semiconductor device according to embodiment 1 of the present invention is described with reference to the drawings. FIGS. 1A to 1C are plan views illustrating the semiconductor device fabrication method of this embodiment. FIG. 2 is an enlarged plan view showing a corner of a wiring board region according to the semiconductor device fabrication method of this embodiment. FIGS. 3A and 3B also serve to illustrate the semiconductor device fabrication method of this embodiment. The semiconductor device fabrication method of this embodiment employs a combination of formation of elongated holes by a drill called a router and punch stamping with a metal mold to fabricate a semiconductor device with a semiconductor element mounted on a wiring board.

Referring to FIG. 1A, the first step is forming registration holes 2 in a wiring board plate 1 and holes 4 at the corners of perimeter lines 3 of respective semiconductor device regions (wiring board regions) defined over the wiring board plate 1. The wiring board plate 1 is a mother plate from which a plurality of wiring boards with semiconductor elements mounted thereon are isolated. The wiring board plate 1 includes a wire part formed of a metal material, such as Cu, and an insulator part formed of a resin and glass cloth, for example. The corner holes 4 are for making rounded surfaces at the corners of the semiconductor device (wiring board).

Then, elongated holes 5 are formed in the wiring board plate 1 along the perimeter line 3 of each wiring board region using a router so as to extend between adjacent corner holes 4. The router used for the formation of the elongated holes 5 has a drill selected according to the material and thickness of the wiring board plate 1. Each of the elongated holes 5 is formed such that the inner longitudinal side of the elongated hole 5 is coincident with the perimeter line 3 of the wiring board region. In each wiring board region, part of the plate between the end of the elongated hole 5 and the corner hole 4 is left unremoved (connecting portion) as shown in FIG. 2. The length of the connecting portion is desirably as small as possible so long as the connecting portion has such a sufficient strength that the frame of the wiring board plate 1 can support the semiconductor device region (wiring board region) during subsequent steps before separation of the semiconductor device regions from the frame. Specifically, the length of the connecting portion is several nanometers, for example.

Then, referring to FIG. 1B, semiconductor elements 6 are mounted at predetermined positions in the respective wiring board regions and electrically connected to the wiring boards. The mounting of the semiconductor elements 6 is carried out using, for example, wire-bonding and flip-chip mounting techniques.

Referring to FIG. 1C, the mounted semiconductor elements 6 are then overmolded with a sealing resin 7. Thereafter, although not shown, solder balls are fixed over the back surfaces of the wiring board regions which serve as external terminals.

Referring to FIGS. 3A and 3B, the resultant wiring board plate 1 is subjected to a perimeter cutting process to isolate the semiconductor device regions into individual semiconductor devices. In this cutting process, the first step is loading the wiring board plate 1 by inserting registration pins 15 of a punch body (metal mold) 14 into the registration holes 2 so that the position of the wiring board plate 1 is fixed. Then, referring to FIG. 3B, the connecting portions are cut using the punch to isolate the semiconductor device regions from the wiring board plate 1 into individual semiconductor devices. In this step, the punching is carried out such that the isolated semiconductor device has a cut edge which extends across part of the connecting portion inside the perimeter line 3 of the wiring board region between the end of the elongated hole 5 and the corner hole 4, the cut edge being angled inward of the wiring board relative to the elongated hole 5 so as to slope downward from the end of the elongated hole 5 to the corner hole 4.

Referring to FIG. 2, the angle of the punch 8 relative to the elongated hole 5, angle θ, may be a small angle in the range of $0°<\theta\leq5°$. Setting angle θ to a large angle would deteriorate the linearity of the after-process perimeter line of an isolated wiring board, and hence would deteriorate the quality of the semiconductor device.

The punch 8 preferably has a sufficient length for covering a region extending between the corner hole 4 and the end of the elongated hole 5. Specifically, in the step illustrated in FIG. 3B, extruding part of the punch 8 which starts from the point of contact with the longitudinal inner side of the elongated hole 5 and which falls within the area of the elongated hole 5 is the margin for the positioning tolerance of the punch 8. The length of the extruding part is set greater than the value required for the tolerances of the punch body (metal mold) 14 and registration holes 2 in order to avoid deformation of the perimeter line of the wiring board by the punch 8 irrespective of the stamping accuracy of the punch 8. The point of contact between the punch 8 and the inner longitudinal side of the elongated hole 5 is, preferably, not at the tip end of the elongated hole 5 but at a position nearer to the central part of the wiring board region than the tip end is. With the point of contact occurring at the tip end of the elongated hole 5, there would be a probability that the after-process perimeter line of an isolated wiring board has a step depending on the shape of the end of the elongated hole 5. Such a disadvantage can be avoided by appropriately adjusting the position of the contact point.

Figure 4:
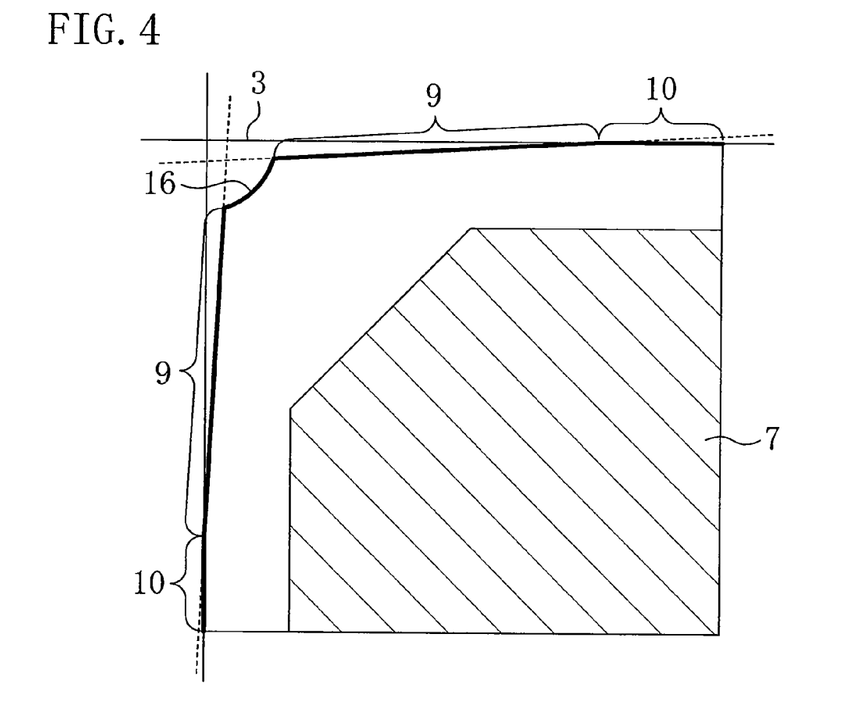
FIG. 4 is a plan view showing the shape of an isolated wiring board according to embodiment 1.

Through the above steps, a semiconductor device which has the perimeter line shown in FIG. 4 can be fabricated. FIG. 4 is a plan view of an isolated wiring board fabricated according to the semiconductor device fabrication method of this embodiment. As shown in FIG. 4, the after-process perimeter line of the isolated wiring board is composed of the first linear parts 10 formed by the router so as to extend toward the corner of the wiring board, the second linear parts 9 formed by the punch 8 which is angled inward of the wiring board so as to slope downward to the corner of the wiring board, and the curve line 16 formed by the hole at the corner of the wiring board so as to be recessed inside the wiring board.

According to the semiconductor device fabrication method of this embodiment, the connecting portion of the wiring board plate is cut by a punch such that the isolated semiconductor device has a cut edge angled inward of the wiring board relative to the longitudinal direction of the elongated hole 5. This method is different from the conventional methods in that the longitudinal direction of the elongated hole 5 is not parallel to the punch and, specifically, the punch 8 is angled relative to the longitudinal direction of the elongated hole 5. With this setting, the end of the punch 8 on the corner side falls in a region closer to the central part of the wiring board region as compared with the conventional methods. As a result, the end of the punch 8 is prevented from falling on the end of the elongated hole 5, so that breakage of the elongated hole 5 by the punch 8 is avoided, and the perimeter line of the semiconductor device is hence without damages.

According to the semiconductor device fabrication method of this embodiment, the above effects can be achieved by setting the angle of the punch 8 relative to the elongated hole 5 to a small angle of 5° or less, for example. Therefore, the perimeter line of the isolated semiconductor device does not have large protrusions or recesses so that deterioration in linearity of the perimeter line is prevented. Thus, a semiconductor device having a generally rectangular shape can be produced. With this rectangular shape, such a trouble can be prevented that the semiconductor device is irregularly caught in an inspection socket or transport tray when inserted into or pulled out of the inspection socket or transport tray. Therefore, by using the semiconductor device fabrication method of this embodiment, breakage of the semiconductor devices which would occur in the steps during and subsequent to fabrication of the wiring boards can be prevented even if the size of the wiring boards is decreased, and accordingly, semiconductor devices with high quality can be produced.

Figure 5:
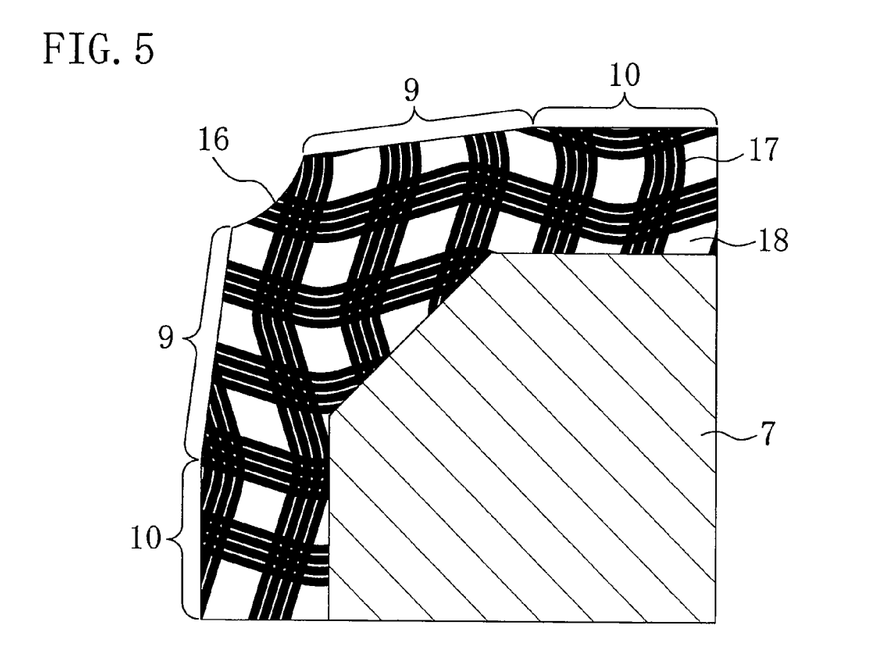
FIG. 5 is an enlarged plan view showing a corner of a wiring board according to embodiment 1.

In the semiconductor device and semiconductor device fabrication method of this embodiment, the wiring board plate 1 may be a base material molded with a resin, the base material being woven of warp and weft fibers. FIG. 5 is an enlarged plan view showing a corner of a wiring board of a semiconductor device of this embodiment.

Referring to FIG. 5, in the semiconductor device of this embodiment, the wiring board is formed by a base material 17 molded with a resin 18. The base material 17 is woven of warp and weft fibers, such as glass cloth. The resin 18 is for improving the strength of the wiring board. The base material 17 is not limited to a glass cloth but has been selected from a variety of materials, such as alamido fiber, in recent years. The wiring board formed by the fiber cloth molded with the resin is free from troubles during formation of the elongated holes by the router but may disadvantageously encounter deformation of the fibers and resin and hence fuzzing of fibers when cut in a metal mold process with a punch, or the like. Especially when the process surface is parallel to fibers, the fibers may be largely exposed over the cut surface, resulting in large fuzzing of fibers.

To avoid such troubles, the semiconductor device and semiconductor device fabrication method of this embodiment are designed such that, as shown in FIG. 5, the first linear part 10 formed by the router so as to extend toward the corner of the wiring board is not parallel to the second linear part 9 formed by the punch which is angled inward of the wiring board so as to slope downward from the first linear part 10 to the corner of the wiring board. Therefore, when the first linear part 10 is coincident with the direction of the fibers, the second linear part 9 is not parallel to the direction of the fibers, and the cut surface formed by the punch is not parallel to the direction of the fibers. Thus, with the semiconductor device and semiconductor device fabrication method of this embodiment, exposure of the fibers in a processed surface can be decreased, and falling of the fibers from the resin and fuzzing of the fibers can be prevented, as compared with the conventional devices and methods. As a result, a semiconductor device with higher quality can be produced.

Isolation of semiconductor devices from the wiring board plate 1 by the punch may be performed after the semiconductor elements 6 are mounted on the wiring board plate 1. Alternatively, mounting of the semiconductor elements 6 on wiring boards may be performed after the wiring boards are isolated from the wiring board plate 1.

Embodiment 2

Figure 6A:
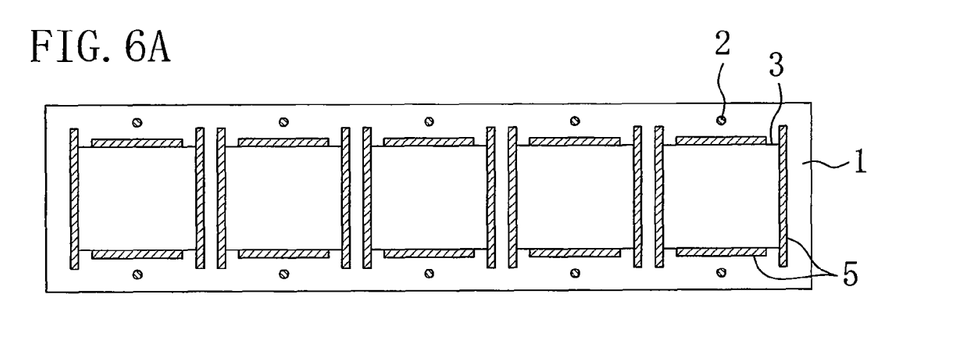
FIGS. 6A to 6C are plan views illustrating a semiconductor device fabrication method according to embodiment 2 of the present invention.
Figure 6B:
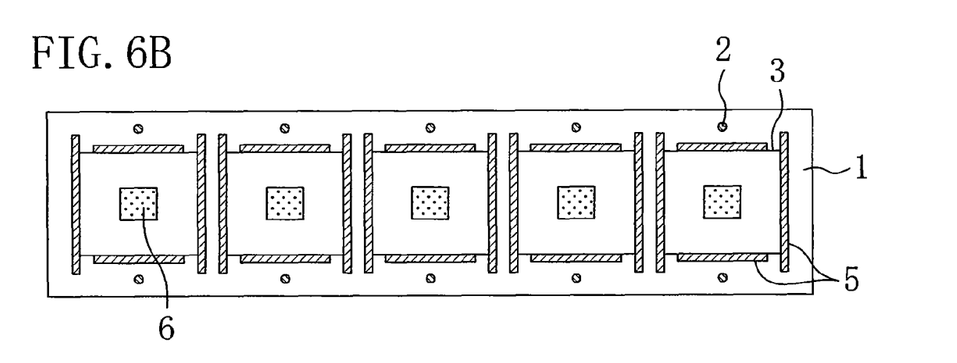
Figure 6C:
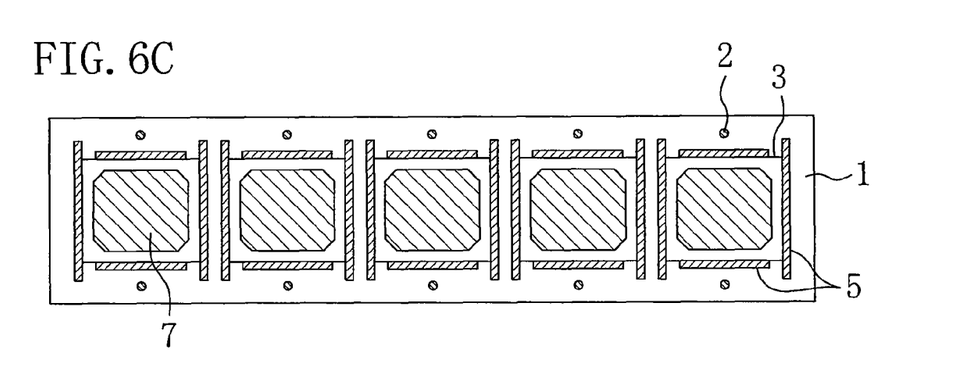
Figure 7:
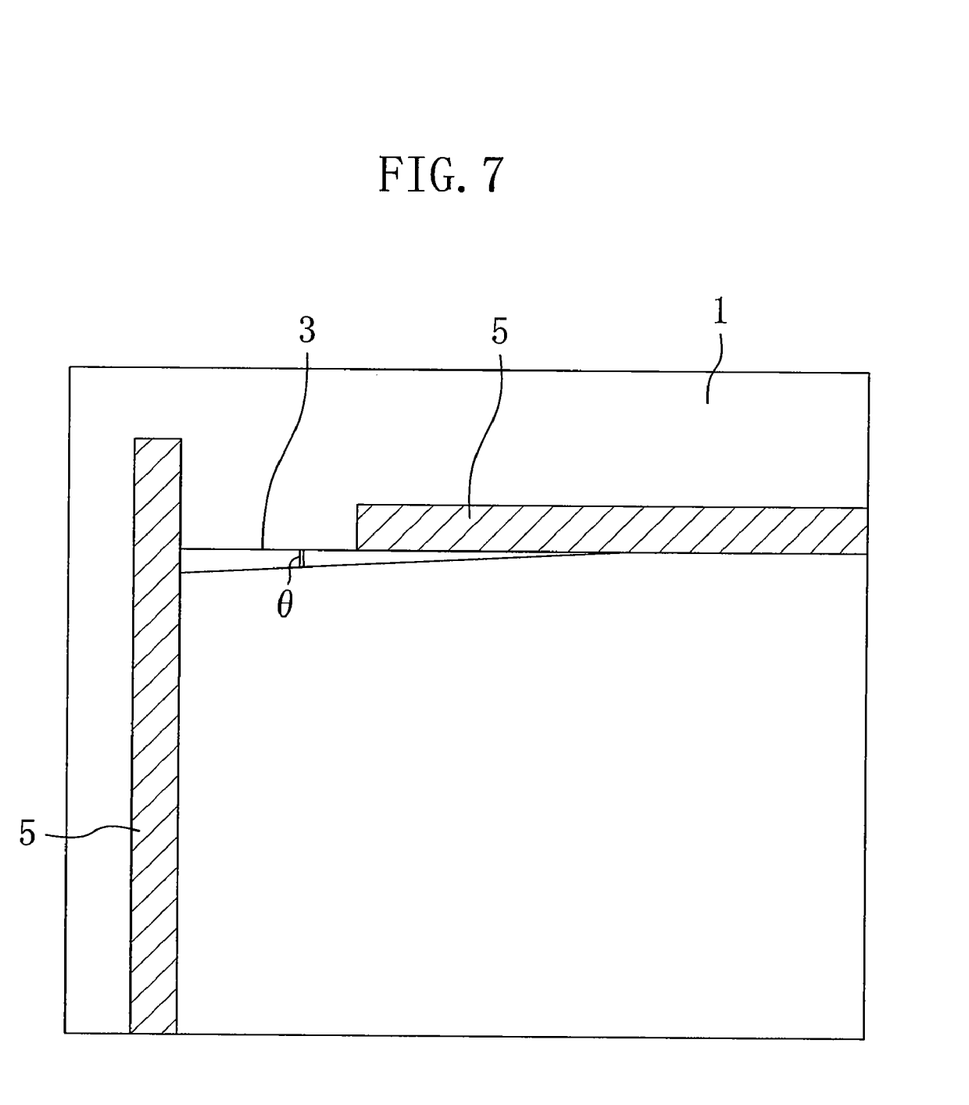
FIG. 7 is an enlarged plan view showing a corner of a wiring board region according to embodiment 2.
Figure 8A:
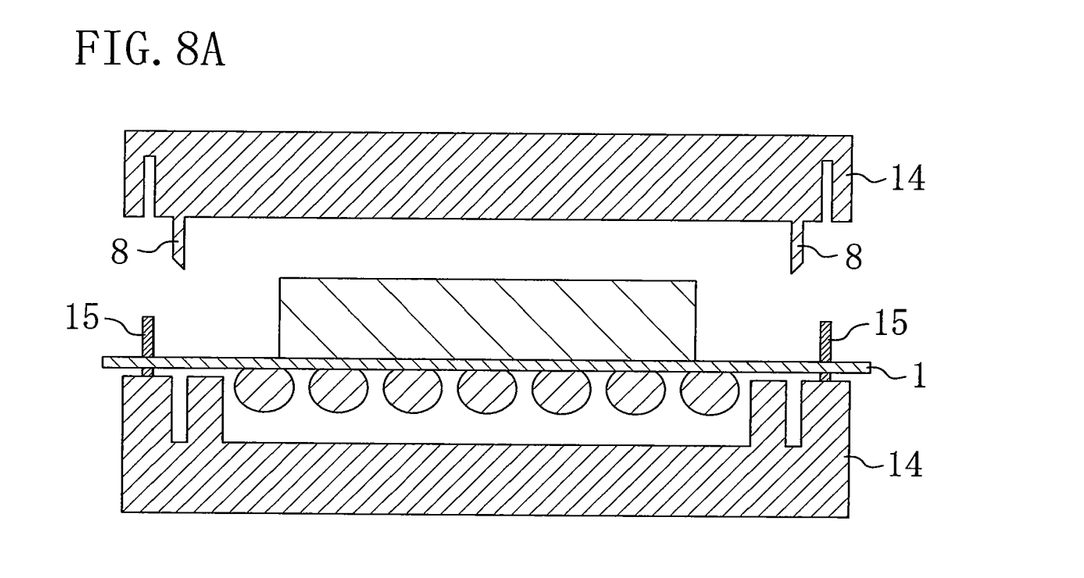
FIGS. 8A and 8B illustrate the semiconductor device fabrication method according to embodiment 2.
Figure 8B:
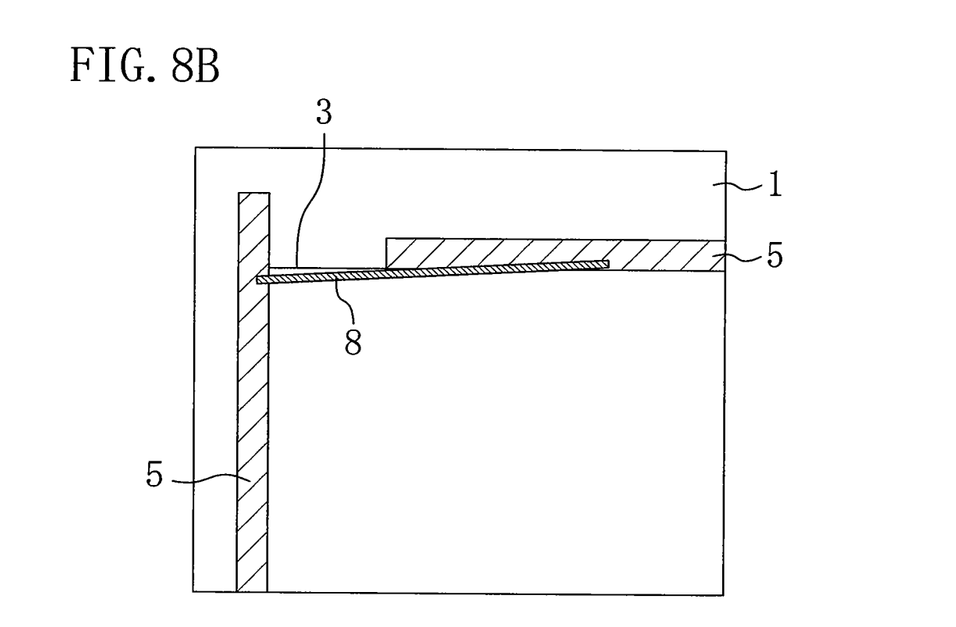

Hereinafter, a method for fabricating a semiconductor device according to embodiment 2 of the present invention is described with reference to the drawings. FIGS. 6A to 6C are plan views illustrating the semiconductor device fabrication method of this embodiment. FIG. 7 is an enlarged plan view showing a corner of a wiring board region according to the semiconductor device fabrication method of this embodiment. FIGS. 8A and 8B also serve to illustrate the semiconductor device fabrication method of this embodiment. The semiconductor device fabrication method of this embodiment is different from embodiment 1 in the step of forming elongated holes. The description of equivalent elements is herein omitted.

Referring to FIG. 6A, the first step is forming registration holes 2 in a wiring board plate 1 for respective wiring board regions defined over the wiring board plate 1 and forming elongated holes 5 in the wiring board plate 1 along the perimeter line of each wiring board region using a router. The router used for the formation of the elongated holes 5 has a drill selected according to the material and thickness of the wiring board plate 1. Each of the elongated holes 5 is formed such that the inner longitudinal side of the elongated hole 5 is coincident with the perimeter line 3 and that four connecting portions are left unremoved at the corners of the wiring board region. In this step, for each wiring board region, for example, a pair of elongated holes 5 are formed along the first side of the perimeter line so as to extend in the X direction, and another pair of elongated holes 5 are formed along the second side of the perimeter line which is adjacent to the first side so as to extend in the Y direction. The elongated holes 5 formed along the second side are formed so as to reach outside the perimeter line. The length of the connecting portion is desirably as small as possible so long as the connecting portion has such a sufficient strength that the frame of the wiring board plate 1 can support the semiconductor device region. Specifically, the length of the connecting portion is several nanometers, for example.

Then, referring to FIG. 6B, semiconductor elements 6 are mounted at predetermined positions in the respective wiring board regions and electrically connected to the wiring boards using, for example, wire-bonding and flip-chip mounting techniques.

Referring to FIG. 6C, the mounted semiconductor elements 6 are then overmolded with a sealing resin 7. Thereafter, although not shown, solder balls are fixed over the back surfaces of the wiring board regions which serve as external terminals.

Referring to FIG. 8A, the resultant wiring board plate 1 is then loaded on a punch body 14 by inserting registration pins 15 of the punch body 14 into the registration holes 2 of the wiring board plate 1 so that the position of the wiring board plate 1 is fixed. Then, referring to FIG. 8B, the connecting portions are cut using the punch to isolate the semiconductor device regions from the wiring board plate 1 into individual semiconductor devices. In this step, the punching is carried out such that the isolated semiconductor device has a cut edge which extends across part of the connecting portion inside the perimeter line 3 of the wiring board region between the end of the elongated hole 5 provided on the first side (first elongated hole) and the end of the elongated hole 5 provided on the second side (second elongated hole), the cut edge being angled inward of the wiring board relative to the first elongated hole 5 so as to slope downward to the end of the second elongated hole 5.

Referring to FIG. 7, the angle of the punch 8 relative to the elongated hole 5, angle θ, may be a small angle in the range of 0°<θ≦5°. Setting angle θ to a large angle would deteriorate the linearity of the after-process perimeter line of an isolated wiring board, and hence would deteriorate the quality of the semiconductor device.

The punch 8 preferably has a sufficient length for covering a region extending between the end of the first elongated hole 5 on the first side and the end of the second elongated hole 5 on the second side. Specifically, in the step illustrated in FIG. 8B, extruding part of the punch 8 which starts from the point of contact with the longitudinal inner side of the elongated hole 5 and which falls within the area of the elongated hole 5 is the margin for the positioning tolerance of the punch 8. The length of the extruding part is set greater than the value required for the tolerances of the punch body (metal mold) 14 and registration holes 2 in order to avoid deformation of the perimeter line of the wiring board by the punch 8 irrespective of the stamping accuracy of the punch 8. The point of contact between the punch 8 and the inner longitudinal side of the elongated hole 5 is, preferably, not at the tip end of the elongated hole 5 but at a position nearer to the central part of the wiring board region than the tip end is. With the point of contact occurring at the tip end of the elongated hole 5, there would be a probability that the after-process perimeter line of an isolated wiring board has a step depending on the shape of the end of the elongated hole 5. Such a disadvantage can be avoided by appropriately adjusting the position of the contact point.

Figure 9:
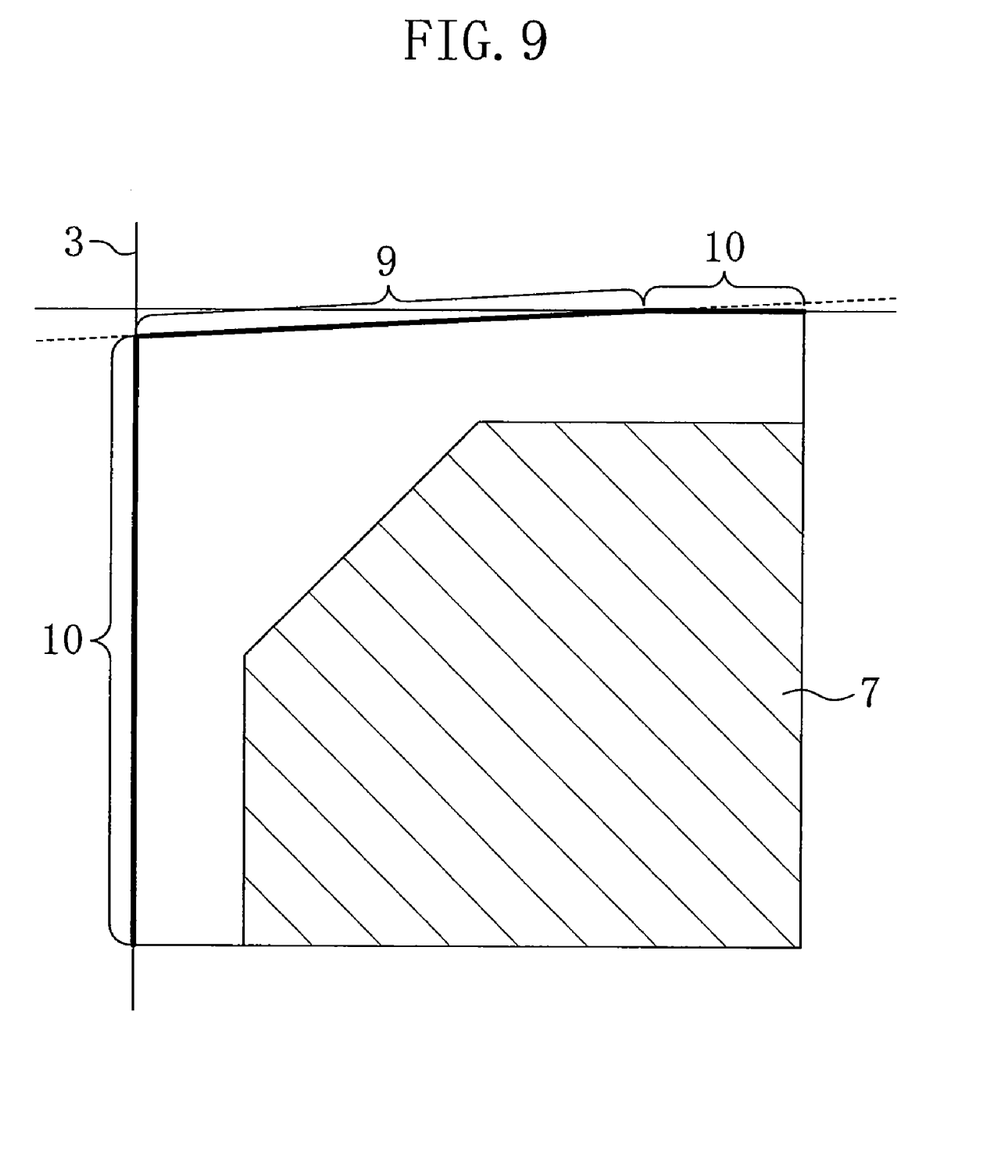
FIG. 9 is a plan view showing the shape of an isolated wiring board according to embodiment 2.

Through the above steps, a semiconductor device which has the perimeter line shown in FIG. 9 can be fabricated. FIG. 9 is a plan view of an isolated wiring board fabricated according to the semiconductor device fabrication method of this embodiment. As shown in FIG. 9, the after-process perimeter line of the isolated wiring board is composed of the first linear parts 10 formed by the router so as to extend toward the corner of the wiring board, and the second linear part 9 formed by the punch 8 which is angled inward of the wiring board so as to slope downward from the first linear part 10 to the corner of the wiring board.

According to the semiconductor device fabrication method of this embodiment, the connecting portion of the wiring board plate is cut by a punch such that the isolated semiconductor device has a cut edge angled inward of the wiring board relative to the longitudinal direction of the elongated hole 5. With this method, the end of the punch 8 is prevented from falling on the end of the elongated hole 5, so that breakage of the elongated hole 5 by the punch 8 is avoided, and the perimeter line of the semiconductor device is hence without damages.

The semiconductor device fabrication method of this embodiment is different from embodiment 1 in that one of adjacent elongated holes 5 is formed so as to reach outside the perimeter line instead of forming a hole at a corner of the wiring board. With this method, the step of forming the corner hole can be omitted, and the number of punch stamping steps can be reduced from that of the fabrication method of embodiment 1. Also, the corner of the semiconductor device can substantially have a right angle. As a result, the production cost can be reduced while the quality of the semiconductor device can be improved. Therefore, by using the semiconductor device fabrication method of this embodiment, breakage of the semiconductor devices which would occur in the steps during and subsequent to fabrication of the wiring boards can be prevented relatively easily even if the size of the wiring boards is decreased, and accordingly, semiconductor devices with high quality can be produced.

According to the semiconductor device fabrication method of this embodiment, the elongated hole 5 formed so as to reach outside the perimeter line extends in the Y direction along the perimeter line, to which the present invention however is not limited. Alternatively, the elongated hole 5 formed so as to reach outside the perimeter line may extend in the X direction along the perimeter line while a shorter elongated hole 5 is formed so as to extend in the Y direction with a connecting portion left on the same side.

Figure 10A:
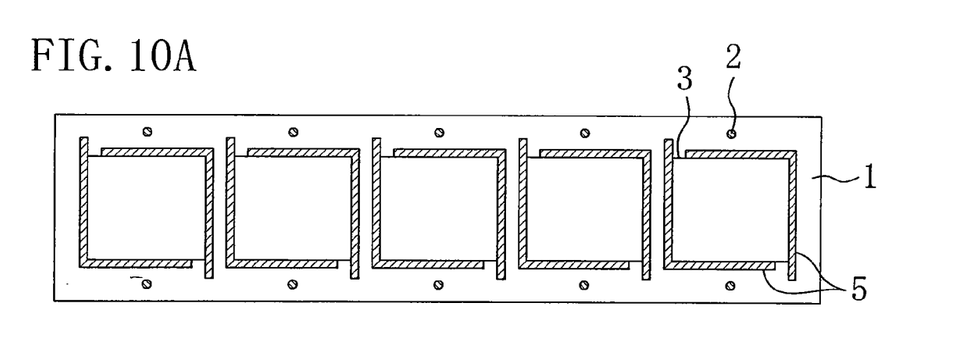
FIGS. 10A to 10C are plan views illustrating the first variation of the semiconductor device fabrication method of embodiment 2.
Figure 10B:
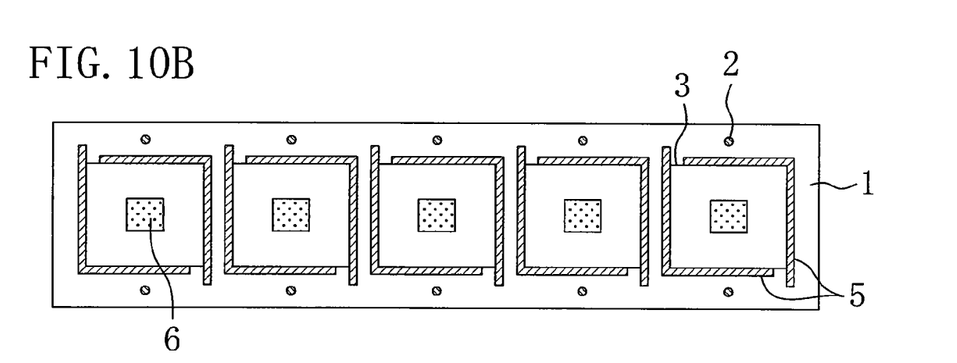
Figure 10C:
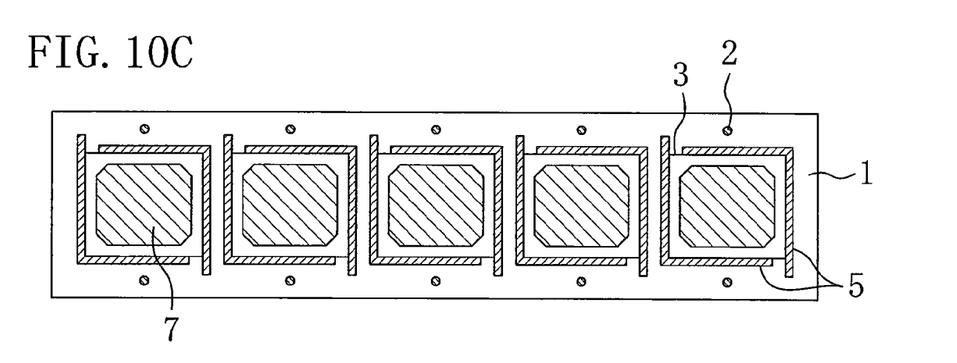
Figure 11A:
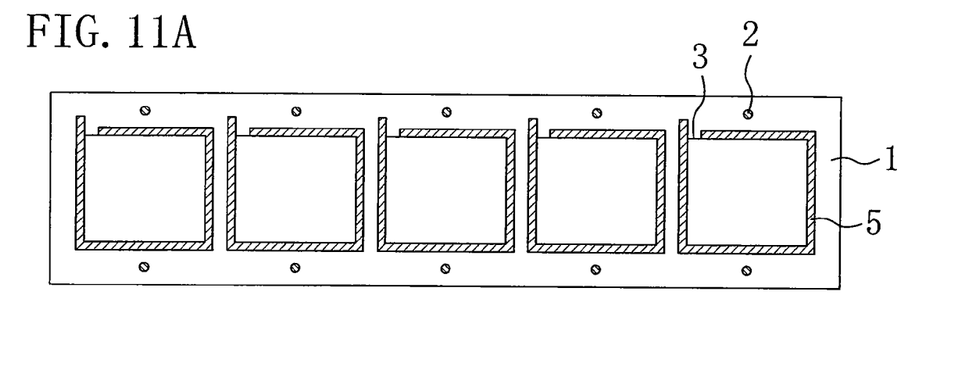
FIGS. 11A to 11C are plan views illustrating the second variation of the semiconductor device fabrication method of embodiment 2.
Figure 11B:
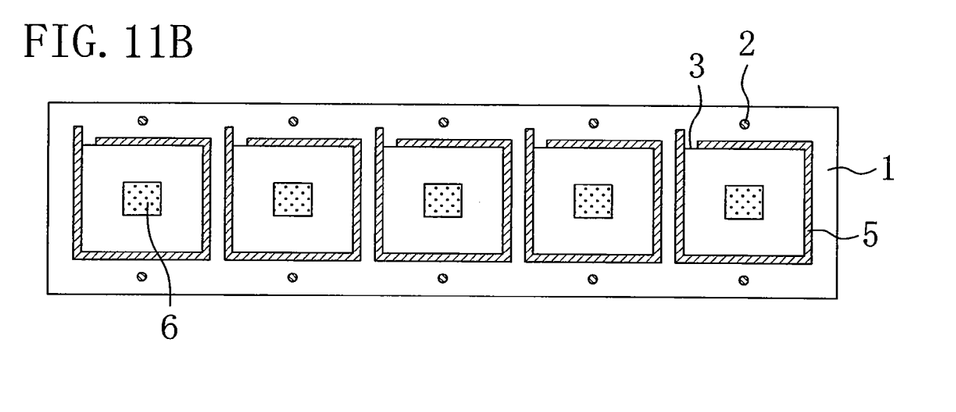
Figure 11C:
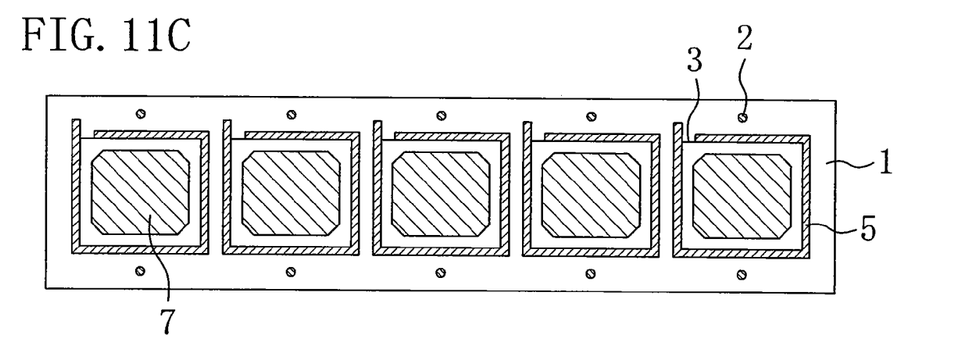

In the above example of the semiconductor device fabrication method of this embodiment, the elongated holes 5 are formed in the step of FIG. 6A so as to leave four connecting portions at the corners of each wiring board region. However, alternatively, the elongated holes may be formed as shown in FIG. 10A or FIG. 11A. FIGS. 10A to 10C are plan views illustrating the first variation of the semiconductor device fabrication method of this embodiment. FIGS. 11A to 11C are plan views illustrating the second variation of the semiconductor device fabrication method of this embodiment.

Referring to FIG. 10A, the first step of the first variation of the fabrication method of this embodiment is forming registration holes 2 in a wiring board plate 1 and forming elongated holes 5 in the wiring board plate 1 along the perimeter line of each wiring board region using a router. Each of the elongated holes 5 is formed such that the inner longitudinal side of the elongated hole 5 is coincident with the perimeter line 3 and that two connecting portions are left unremoved at two corners of the wiring board region.

Thereafter, referring to FIGS. 10B and 10C, semiconductor elements 6 are mounted at predetermined positions in the respective wiring board regions, and then, the mounted semiconductor elements 6 are overmolded with a sealing resin 7 in the same way as that described above in the first example of this embodiment.

The subsequent steps are basically the same as those of the first example of the fabrication method of this embodiment, which are not herein illustrated in the drawings. The two connecting portions of the respective wiring board regions are cut using a punch, whereby the semiconductor device regions are isolated from the wiring board plate 1 into semiconductor devices. In this punching step, the connecting portion is cut such that the isolated wiring board has a cut edge which extends across part of the connecting portion inside the perimeter line between an end of an elongated hole 5 provided on a side of the perimeter line 3 extending in the X direction and an end of another elongated hole 5 provided on a side of the perimeter line 3 extending in the Y direction, the cut edge being angled inward of the wiring board so as to slope downward to the end of the elongated hole 5 provided on the side of the perimeter line 3 extending in the Y direction.

Referring to FIG. 11A, the first step of the second variation of the fabrication method of this embodiment is forming registration holes 2 in a wiring board plate 1 and forming elongated holes 5 in the wiring board plate 1 along the perimeter lines of each wiring board region using a router. Each of the elongated holes 5 is formed such that the inner longitudinal side of the elongated hole 5 is coincident with the perimeter line 3 and that one connecting portion is left unremoved at a corner of the wiring board region.

Thereafter, referring to FIGS. 11B and 11C, semiconductor elements 6 are mounted at predetermined positions in the respective wiring board regions, and then, the mounted semiconductor elements 6 are overmolded with a sealing resin 7 in the same way as that described above in the first example of this embodiment.

The subsequent steps are basically the same as those of the first example of the fabrication method of this embodiment, which are not herein illustrated in the drawings. The one connecting portion for the respective wiring board regions is cut using a punch, whereby the semiconductor device regions are isolated from the wiring board plate 1 into semiconductor devices. In this punching step, the connecting portion is cut such that the isolated wiring board has a cut edge which extends across part of the connecting portion inside the perimeter line 3 of the wiring board region between an end of an elongated hole 5 provided on a side of the perimeter line 3 extending in the X direction and an end of another elongated hole 5 provided on a side of the perimeter line 3 extending in the Y direction, the cut edge being angled inward of the wiring board so as to slope downward to the end of the elongated hole 5 provided on the side of the perimeter line 3 extending in the Y direction.

In the first and second variations of the semiconductor device fabrication method of this embodiment, the elongated holes formed have different shapes from the first example of this embodiment so that the number of connecting portions which are to be cut by the punch is smaller than that of the first example. As a result, the after-process perimeter line of an isolated semiconductor device has a smaller number of transitions between the cut lines formed by the router and the cut lines formed by the punch. Accordingly, the linearity of the perimeter line of the semiconductor device can be further improved. Thus, semiconductor devices having a generally rectangular shape can stably be produced.

Note that the examples and variations described above may be combined as necessary without departing from the spirit of the invention.

A semiconductor device and fabrication method thereof, which fall within the scope of the present invention, are useful for size reduction and higher packaging density of semiconductor devices, for example.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. A semiconductor device, comprising:
    a wiring board; and
    a semiconductor element mounted on the wiring board,
    wherein at least one side of the wiring board is formed by
        a first linear part extending toward a corner of the wiring board and a second linear part angled inward of the wiring board so as to slope downward from the first linear part to the corner of the wiring board.

2. The semiconductor device of claim 1, wherein
    the corner of the wiring board has a curved part recessed inside the wiring board, and
    at least one side of the wiring board is formed by the first linear part, the second linear part, and the curved part.

3. The semiconductor device of claim 1, wherein an angle θ of the second linear part relative to the first linear part is in the range of $0°<\theta\leq5°$.

4. The semiconductor device of claim 1, wherein
    the wiring board is formed by a base material molded with a resin, the base material being woven of warp and weft fibers, and
    the second linear part extends in a direction not parallel to the fibers of the base material.

* * * * *